United States Patent
Kim

[19]

[11] Patent Number: 5,818,213
[45] Date of Patent: Oct. 6, 1998

[54] BACK BIAS VOLTAGE DETECTION CIRCUIT FOR SEMICONDUCTOR MEMORY DEVICE

[76] Inventor: Hong Seok Kim, c/o, Hyundai Electronics Industries Co., Ltd., San 136-1, Ami-ri, Bubal-eub Ichon-kun, Kyoungki-do, Rep. of Korea

[21] Appl. No.: 525,276

[22] Filed: Sep. 8, 1995

[30] Foreign Application Priority Data

Sep. 12, 1994 [KR] Rep. of Korea ...................... 94-22909

[51] Int. Cl.⁶ ...................................................... G05F 3/16
[52] U.S. Cl. ............... 323/315; 365/189.09; 365/189.06; 327/537; 327/535
[58] Field of Search ................................... 323/311–315; 327/534, 535, 537, 539, 546, 309; 365/189.01, 189.09, 189.06

[56] References Cited

U.S. PATENT DOCUMENTS

| 5,262,989 | 11/1993 | Lee et al. | 365/189.01 |
| 5,264,784 | 11/1993 | Oritiz | 323/315 |
| 5,270,584 | 12/1993 | Koshikawa et al. | 327/537 |
| 5,315,557 | 5/1994 | Kim et al. | 365/222 |

*Primary Examiner*—Peter S. Wong
*Assistant Examiner*—Shawn Riley

[57] ABSTRACT

A back bias voltage detection circuit used for a semiconductor memory device wherein a threshold voltage of an NMOS transistor is varied by the back bias voltage. The threshold voltage of the NMOS transistor is detected by comparison to a reference voltage and the back bias voltage is adjusted according to the threshold voltage, with variable amplification of the back bias voltage. This control of the back bias voltage provides more effective control of the threshold voltage of the NMOS transistor.

4 Claims, 4 Drawing Sheets

5,818,213

BACK BIAS VOLTAGE DETECTION CIRCUIT FOR SEMICONDUCTOR MEMORY DEVICE

BACKGROUND OF THE INVENTION

1. Field of the Invention

The present invention relates in general to the detection of a back bias voltage in a semiconductor memory device, and more particularly to a back bias voltage detection circuit which is capable of readily detecting the back bias voltage and enhancing its operating speed.

2. Description of the Prior Art

Generally, a back bias voltage detection circuit detects a back bias voltage to be applied to a well or a substrate. The detected back bias voltage from the back bias voltage detection circuit acts to maintain a junction between the well or the substrate and the associated circuit at a reverse bias state to prevent a faulty operation of the associated circuit. Such a conventional back bias voltage detection circuit will hereinafter be described with reference to FIG. 1.

Referring to FIG. 1, there is shown a circuit diagram of a conventional back bias voltage detection circuit for a semiconductor memory device. As shown in this drawing, the conventional back bias voltage detection circuit comprises PMOS transistors MP1–MP3 and an NMOS transistor MN1. The PMOS transistor MP1 is connected between a supply voltage source Vcc and a node N1, and has a gate connected to a node N2. The PMOS transistor MP3 is connected between the nodes N1 and N2, and has a gate for inputting a back bias voltage Vbb. The PMOS transistor MP2 is connected between the supply voltage source Vcc and a node N3, and has a gate connected to the node N1. The NMOS transistor MN1 is connected between the node N3 and a ground voltage source Vss, and has a gate connected to the node N1.

The conventional back bias voltage detection circuit further comprises buffers G1 and G2 connected in series to the node N3, for outputting a back bias voltage detect signal bbeb.

The operation of the conventional back bias voltage detection circuit with the above-mentioned construction will hereinafter be described.

The back bias voltage Vbb is applied to the gate of the PMOS transistor MP3 to determine the operating state of the PMOS transistor MP3. Namely, if the back bias voltage Vbb is lower than a threshold voltage of the PMOS transistor MP3, the PMOS transistor MP3 is turned on to control the NMOS transistor MN1.

However, the above-mentioned conventional back bias voltage detection circuit has a disadvantage in that it is low in reaction speed because the back bias voltage Vbb is applied to the gate of the PMOS transistor MP3. Also, it is inefficient for the PMOS transistor MP3 to indirectly control a threshold voltage $V_T$ of the NMOS transistor MN1.

SUMMARY OF THE INVENTION

Therefore, the present invention has been made in view of the above problems, and it is an object of the present invention to provide a back bias voltage detection circuit for a semiconductor memory device which is capable of readily detecting a back bias voltage and enhancing its operating speed.

In accordance with the present invention, the above and other objects can be accomplished by a provision of a back bias voltage detection circuit for a semiconductor memory device comprising back bias voltage detection means for detecting a back bias voltage, the back bias voltage detection means including a first NMOS transistor having a threshold voltage varied with a variation in the back bias voltage; and variable resistor means for amplifying the back bias voltage.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
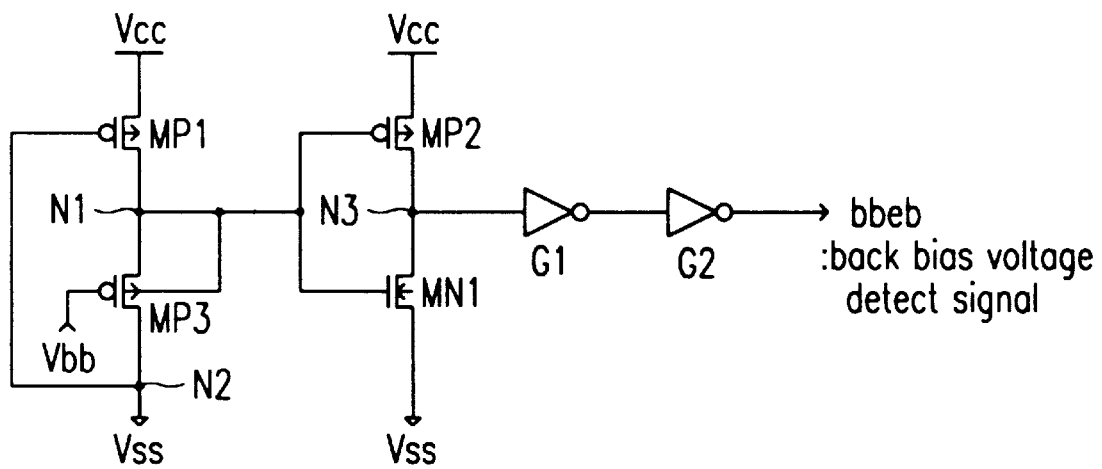
FIG. 1 is a circuit diagram of a conventional back bias voltage detection circuit for a semiconductor memory device.
Figure 2:
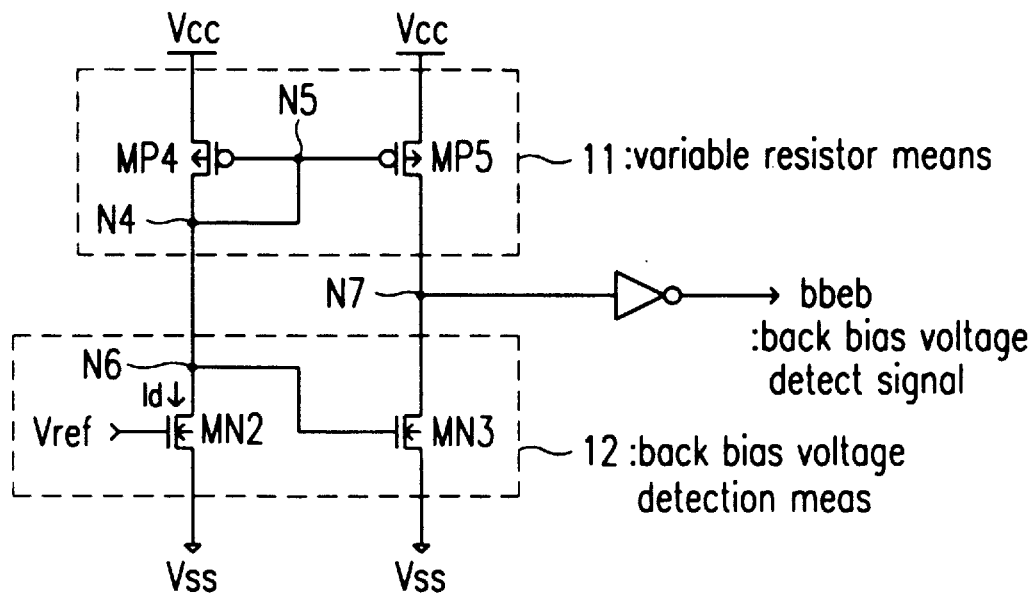
FIG. 2 is a circuit diagram of a back bias voltage detection circuit for a semiconductor memory device in accordance with an embodiment of the present invention.
Figure 4:
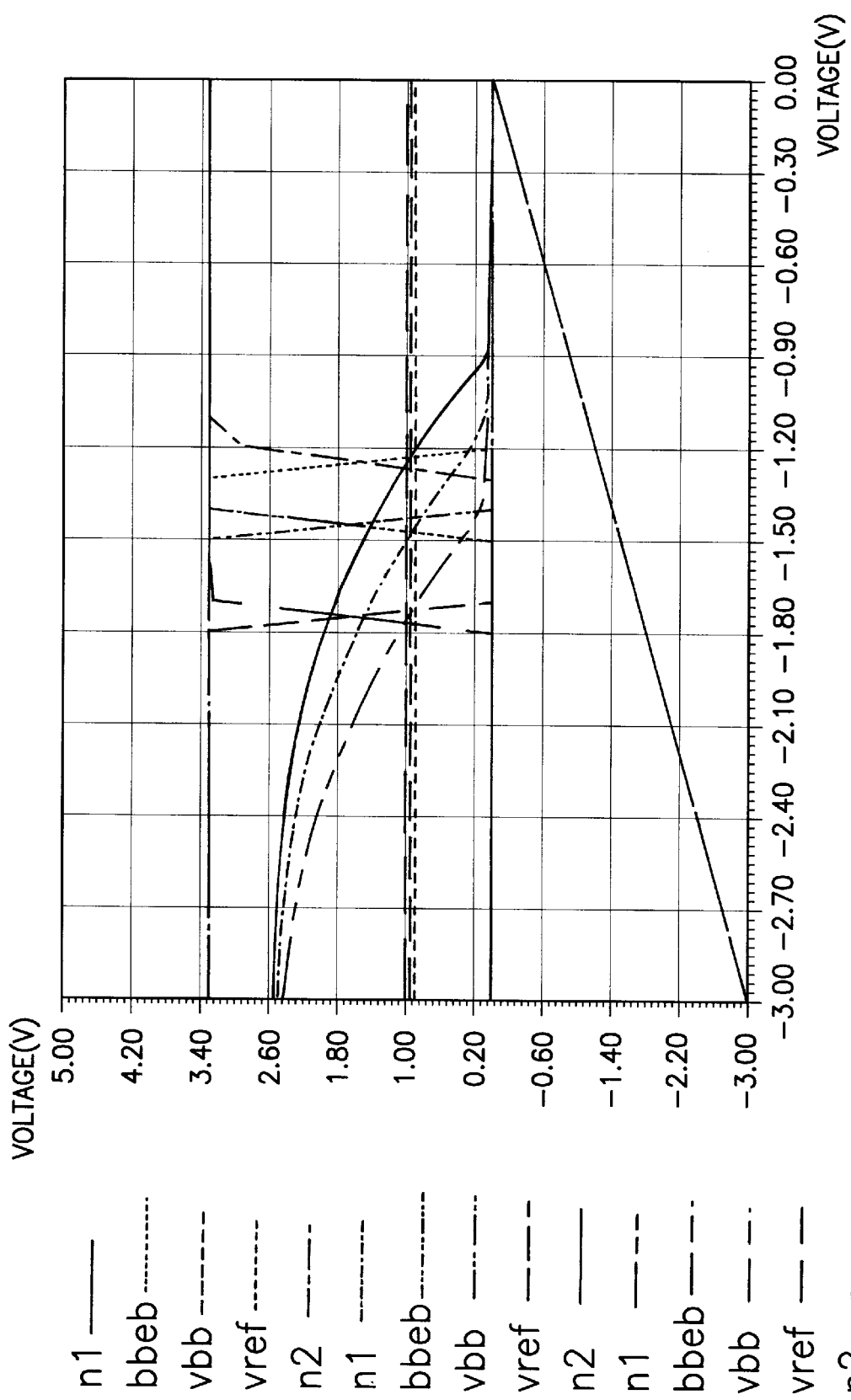
FIG. 4 is a graph illustrating the simulated results in accordance with the first embodiment of the present invention.

FIG. 2 is a circuit diagram of a back bias voltage detection circuit for a semiconductor memory device in accordance with an embodiment of the present invention and FIG. 4 is a graph illustrating the simulated results in accordance with the embodiment of the present invention. As shown in FIG. 2, the back bias voltage detection circuit comprises variable resistor means 11 and back bias voltage detection means 12.

The variable resistor means 11 includes PMOS transistors MP4 and MP5. The PMOS transistor MP4 is connected between a supply voltage source Vcc and a node N4, and has a gate connected to a node N5. The PMOS transistor MP5 is connected between the supply voltage source Vcc and a node N7, and has a gate connected to the node N5. The nodes N4 and N5 are connected to each other.

The back bias voltage detection means 12 includes NMOS transistors MN2 and MN3. The NMOS transistor MR2 is connected between a node N6 and a ground voltage source Vss, and has a gate connected to a reference voltage source Vref. The NMOS transistor MN3 is connected between the node N7 and the ground voltage source Vss, and has a gate connected to the node N6.

The back bias voltage detection circuit further comprises a buffer G3 connected to the node N7, for outputting a back bias voltage detect signal bbeb.

Preferably, the variable resistor means 11 may include a current mirror.

The operation of the back bias voltage detection circuit with the above-mentioned construction in accordance with the embodiment of the present invention will hereinafter be described in detail.

The NMOS transistor MN2 remains at its linear state in response to the reference voltage Vref being applied to the gate thereof. Under this condition, it is possible to enlarge a variation in a drain current $I_d$ of the NMOS transistor MN2 with a variation in a back bias voltage. The back bias voltage level can be detected on the basis of such a fact. The current mirror of the variable resistor means 11 is operated in response to the back bias voltage. With the current mirror operated, the variation in the back bias voltage can be detected at the moment that it has an effect on a threshold voltage $V_T$ of the NMOS transistor MN2.

The threshold voltage $V_T$ of the NMOS transistor MN2 can be expressed as follows:

$$V_T = V_T(0) + (D/\epsilon_{ins}\epsilon_o)\sqrt{2\epsilon_o\epsilon_{sig}N \cdot V_{SB}}^{1/2}$$

where, $q=1.6\times10^{-19}$ [Coulomb] N=substrate concentration $V_{SB}$=back bias voltage As seen from the above equation, the threshold voltage $V_T$ of the NMOS transistor MN2 is proportional to the square root of the back bias voltage $V_{SB}$. Such a variation can be applied to the variation in the drain current $I_d$ of the NMOS transistor MN2 by adjusting the reference voltage Vref to allow the NMOS transistor MN2 to remain at its linear state. The back bias voltage level and reaction speed (response speed) can be adjusted at the linear state of the NMOS transistor MN2. At this time, the drain current $I_d$ can be expressed as follows:

$$I_d = K(W/L) \cdot (V_{GS} - V_T)^2/2$$

where, K=proportional constant $(K=\epsilon_{ins}\epsilon_o\mu_n/D)$ W=channel width of NMOS transistor L=channel length of NMOS transistor As seen from the above equation, the drain current $I_d$ of the NMOS transistor MN2 is proportional to $V_T^2$ to operate the current mirror at high speed.

Figure 3:
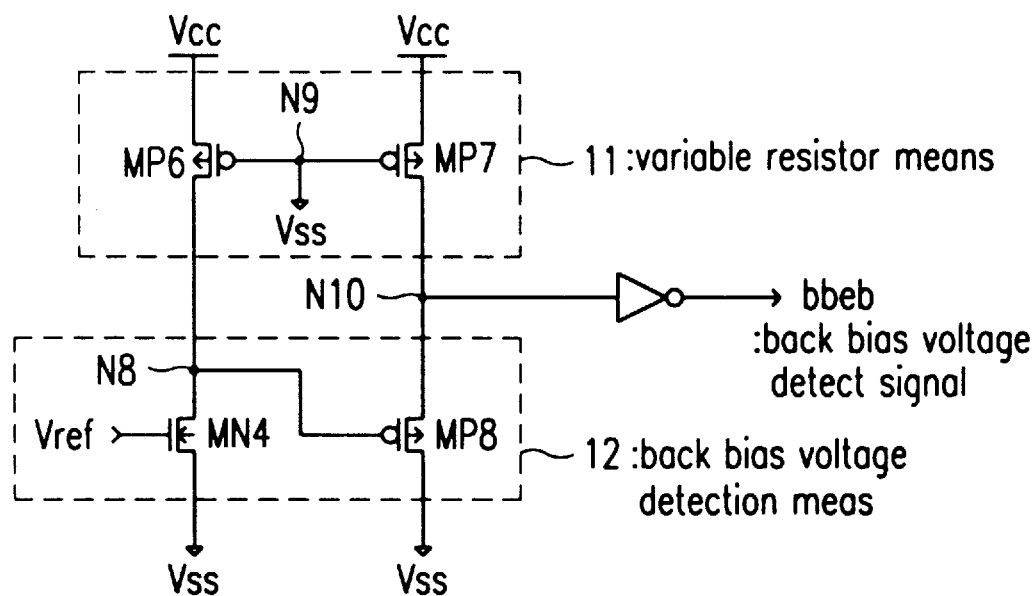
FIG. 3 is a circuit diagram of a back bias voltage detection circuit for a semiconductor memory device in accordance with an alternative embodiment of the present invention.
Figure 5:
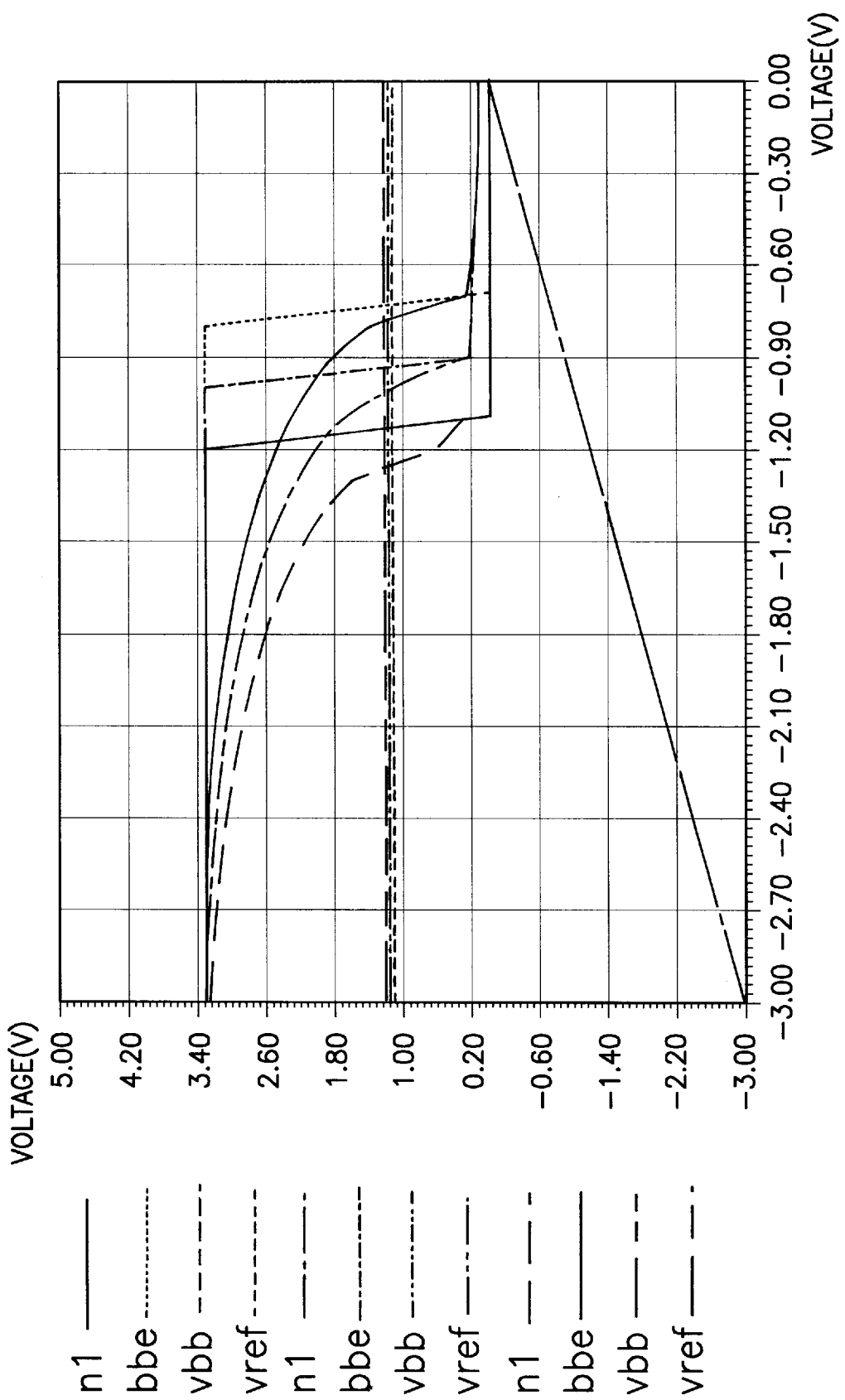
FIG. 5 is a graph illustrating the simulated results in accordance with the second embodiment of the present invention.

FIG. 3 is a circuit diagram of a back bias voltage detection circuit for a semiconductor memory device in accordance with an alternative embodiment of the present invention and FIG. 5 is a graph illustrating the simulated results in accordance with the alternative embodiment of the present invention. As shown in FIG. 3, the back bias voltage detection circuit comprises variable resistor means 11 and back bias voltage detection means 12.

The variable resistor means 11 includes PMOS transistors MP6 and MP7. The PMOS transistor MP6 is connected between a supply voltage source Vcc and a node N8, and has a gate connected to a node N9. The PMOS transistor MP7 is connected between the supply voltage source Vcc and a node N10, and has a gate connected to the node N9. The node N9 is connected to a ground voltage source Vss.

The back bias voltage detection means 12 includes NMOS and PMOS transistors MN4 and MP8. The NMOS transistor MN4 is connected between the node N8 and the ground voltage source Vss, and has a gate connected to a reference voltage source Vref. The PMOS transistor MP8 is connected between the node N10 and the ground voltage source Vss, and has a gate connected to the node N8.

The back bias voltage detection circuit further comprises buffers G4 and G5 connected in series to the node N10, for outputting a back bias voltage detect signal bbeb.

The operation of the back bias voltage detection circuit with the above-mentioned construction in accordance with the alternative embodiment of the present invention will hereinafter be described in detail.

A variation in a back bias voltage of the NMOS transistor MN4 is detected in response to the reference voltage Vref being applied to the gate of the NMOS transistor MN4. The varied back bias voltage is applied to the gate of the PMOS transistor MP8, thereby causing a variation in a threshold voltage of the NMOS transistor MN4 to have no effect on the subsequent stage. Therefore, the back bias voltage can stably be detected.

As apparent from the above description, according to the present invention, the threshold voltage of the NMOS transistor is detected on the basis of the reference voltage and the back bias voltage is adjusted according to the detected threshold voltage. With the back bias voltage adjusted, the threshold voltage of the NMOS transistor can efficiently be controlled. Therefore, the back bias voltage detection circuit of the present invention has the effect of readily detecting the back bias voltage and enhancing its operating speed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A back bias voltage detection circuit for a semiconductor memory device comprising:

back bias voltage detection means for detecting a back bias voltage, said back bias voltage detection means including a first NMOS transistor having a threshold voltage varied with a variation in the back bias voltage, wherein said first NMOS transistor is connected between a first node and a ground voltage source, and has a gate connected to a reference voltage source, and wherein said back bias voltage detection means further includes a second NMOS transistor which is connected between a second node and said ground voltage source and has a gate connected to said first node; and variable resistor means for amplifying the back bias voltage.

2. A back bias voltage detection circuit for a semiconductor memory device comprising:

back bias voltage detection means for detecting a back bias voltage, said back bias voltage detection means including a first NMOS transistor having a threshold voltage varied with a variation in the back bias voltage, wherein said first NMOS transistor is connected between a first node and a ground voltage source, and has a gate connected to a reference voltage source, and wherein said back bias voltage detection means further includes a PMOS transistor which is connected between a second node and said ground voltage source and has a gate connected to said first node; and variable resistor means for amplifying the back bias voltage.

3. A back bias voltage detection circuit for a semiconductor memory device comprising:

back bias voltage detection means for detecting a back bias voltage, said back bias voltage detection means including a first NMOS transistor having a threshold voltage varied with a variation in the back bias voltage; and variable resistor means for amplifying the back bias voltage, wherein said variable resistor means includes a current mirror.

4. A back bias voltage detection circuit for a semiconductor memory device comprising:

back bias voltage detection means for detecting a back bias voltage, said back bias voltage detection means including a first NMOS transistor having a threshold voltage varied with a variation in the back bias voltage; and variable resistor means for amplifying the back bias voltage, wherein said variable resistor means includes a current mirror, and wherein said variable resistor means further includes:

a first PMOS transistor which is connected between a supply voltage source and a first node and has a gate connected to a second node; and a second PMOS transistor which is connected between said supply voltage source and a third node and has a gate connected to said second node, said second node being connected to a ground voltage source.

* * * * *